United States Patent [19]

Deri

[11] Patent Number: 5,125,050
[45] Date of Patent: Jun. 23, 1992

[54] VERTICAL METALLICALLY LOADED POLARIZATION SPLITTER AND POLARIZATION-DIVERSIFIED OPTICAL RECEIVER

[75] Inventor: Robert J. Deri, Rumson, N.J.

[73] Assignee: Bell Communications Research, Inc., Livingston, N.J.

[21] Appl. No.: 695,415

[22] Filed: May 3, 1991

[51] Int. Cl.$^5$ .............................................. G02B 6/10
[52] U.S. Cl. ...................................... 385/11; 385/28; 385/131
[58] Field of Search ................... 385/11, 27, 28, 29, 385/40, 131

[56] References Cited

U.S. PATENT DOCUMENTS 3,920,314  11/1975  Yajima ................................ 385/9 X
4,943,131   7/1990  Taki ..................................... 385/29

OTHER PUBLICATIONS

M. Erman et al, "The integration of waveguides, optical devices and detectors on InP for implementation in optical diversity coherent receivers," *15th European conference on Optical Communications* (ECOC '89), 1989, vol. 2, pp. 121-128.
P. Albrecht et al, "TE/TM Mode Splitters on InGaAsP/InP," IEEE Photonics Letters, 1990, vol. 2, pp. 114-115.
R. J. Deri et al, "Impedance matching for enhanced waveguide/photodetector integration," Applied physics Letters, 1989, vol. 55, pp. 2712-2714.
R. J. Hawkins et al, "Optical power transfer in vertically integrated impedance-matched waveguide/photodetectors: physics and implications for diode-length reduction," 1991, *Optics Letters*, vol. 16, pp. 470-472.
H. Yanagawa et al, "High Extinction Guided-Wave Optical Polarization Splitter," *IEEE Photonics Technology Letters*, 1991, vol. 3, pp. 17-18.

*Primary Examiner*—Akm E. Ullah
*Assistant Examiner*—John Ngo
*Attorney, Agent, or Firm*—Leonard Charles Suchyta; Charles S. Guenzer

[57] ABSTRACT

A polarization diversity receiver comprising a lower optical waveguide and an upper waveguide formed thereover in the area of the receiver. A rib formed in the lower waveguide away from the receiver directs light along an optical axis in the receiver. A metal layer deposited over the upper waveguide preferentially couples light of the TE-mode from the lower to the upper waveguide, where it is detected by a p—i—n photo-diode. A second p—i—n photo-diode is formed on the optical axis a distance away from the first photo-diode. The intervening region acts as a coupling region to couple the remaining TM-mode radiation from the lower to the upper waveguide, where it is detected by the second photo-diode.

10 Claims, 3 Drawing Sheets

VERTICAL METALLICALLY LOADED POLARIZATION SPLITTER AND POLARIZATION-DIVERSIFIED OPTICAL RECEIVER

FIELD OF THE INVENTION

The invention relates generally to integrated-circuit optical waveguides. In particular, the invention relates to optical polarization splitters for such waveguides and to optical detectors and receivers.

BACKGROUND ART

Opto-electronic integrated circuits (OEICs) often require discrimination between the two polarizations of light carried on the waveguide in the OEIC. For example, as illustrated in the plan view of FIG. 1, a polarization-diversified optical receiver 10 must separately detect the TE and TM polarization modes carried on a first waveguide 12. A laterally arranged polarization splitter 14 is formed in which the first waveguide 12 is brought to within a small distance s of a second waveguide 16 and extends in parallel with it for an interaction length L, along which the second waveguide 16 is covered with a metal layer 18. The metal layer 18 metallically loads the second waveguide 16 so as to eliminate any guiding of the TM mode on it. Thereby, the TM mode stays on the first waveguide 12. The interaction length L is chosen to be one interaction length so that the TE mode is completely transferred to the second waveguide mode but the TM mode remains on the first waveguide 12. Separate photo-diode optical detectors 18 and 20 placed at the ends of the two waveguides 16 and 12 detect the optical intensities of the TE and TM modes respectively. Erman et al. disclose such a polarization-diversified receiver in "The integration of waveguides, optical devices and detectors on InP for implementation in optical diversity coherent receivers," 15th European Conference on Optical Communications (ECOC '89), volume 2, 1989, pp. 121–128. Albrecht et al. also disclose a laterally arranged polarization splitter in "TE/TM mode splitters on InGaAsP/InP," IEEE Photonics Technology Letters, volume 2, 1990, pp. 114–115.

The prior-art polarization splitter 10 suffers several disadvantages. The length L of the interaction region is typically 1 to 5 mm and is limited by the smallest gap s obtainable between the two waveguides 12 and 16, typically 2 μm. The size is further increased by the necessity that waveguide bends 22 should have radii of greater than 5 mm to minimize bend radiation losses. Further, the attempt to minimize the gap s places its fabrication at the limits of lithography so that processing variations occur, thereby degrading reproducibility.

Cheung and Zah have disclosed one solution to the problems of the polarization-diversified receiver in U.S. patent application Ser. No. 07/649,659, filed Feb. 1, 1991. They dispense with the polarization splitter 14 and instead used two photo-diode detectors, arranged serially on the same waveguide. The first detector has a compressively strained quantum-well layer in the waveguide so that it detects and absorbs only the TE-mode radiation. The second detector, which may be of conventional design, detects the remaining radiation, the TM mode. Their polarization selectivity suffers from the disadvantage that it requires complex growth, namely, growth of a waveguide layer having compressively strained quantum-well region in one linear portion and at a minimum a corresponding unstrained region in another portion.

SUMMARY OF THE INVENTION

Accordingly, it is an object of the invention to discriminate between polarizations in a small area and with standard processing techniques of minimum complexity.

It is a further object of the invention to provide for a polarization-diversified receiver based on such a polarization splitter.

The invention can be summarized as a vertically arranged, metallically loaded optical polarization splitter in which a waveguide is overlaid with a metallic load so as to preferentially couple TE-mode radiation into an overlying optical region, possibly a second waveguide. An optical detector can be attached to the second waveguide for detecting the TM-mode intensity. The light remaining on the first waveguide, i.e., the TM mode, can couple in a non-loaded region into the second waveguide where it is detected by a second detector.

DETAILED DESCRIPTION OF THE PREFERRED EMBODIMENT

Figure 1:
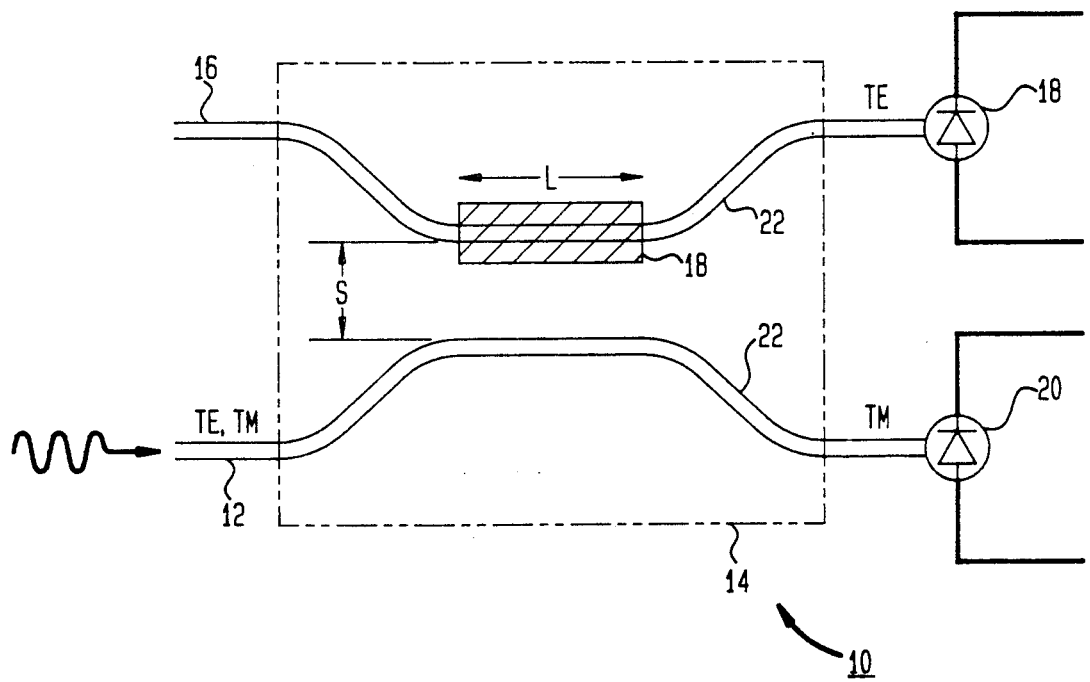
FIG. 1 is a plan view of a prior-art polarization-diversity receiver and polarization splitter.
Figure 2:
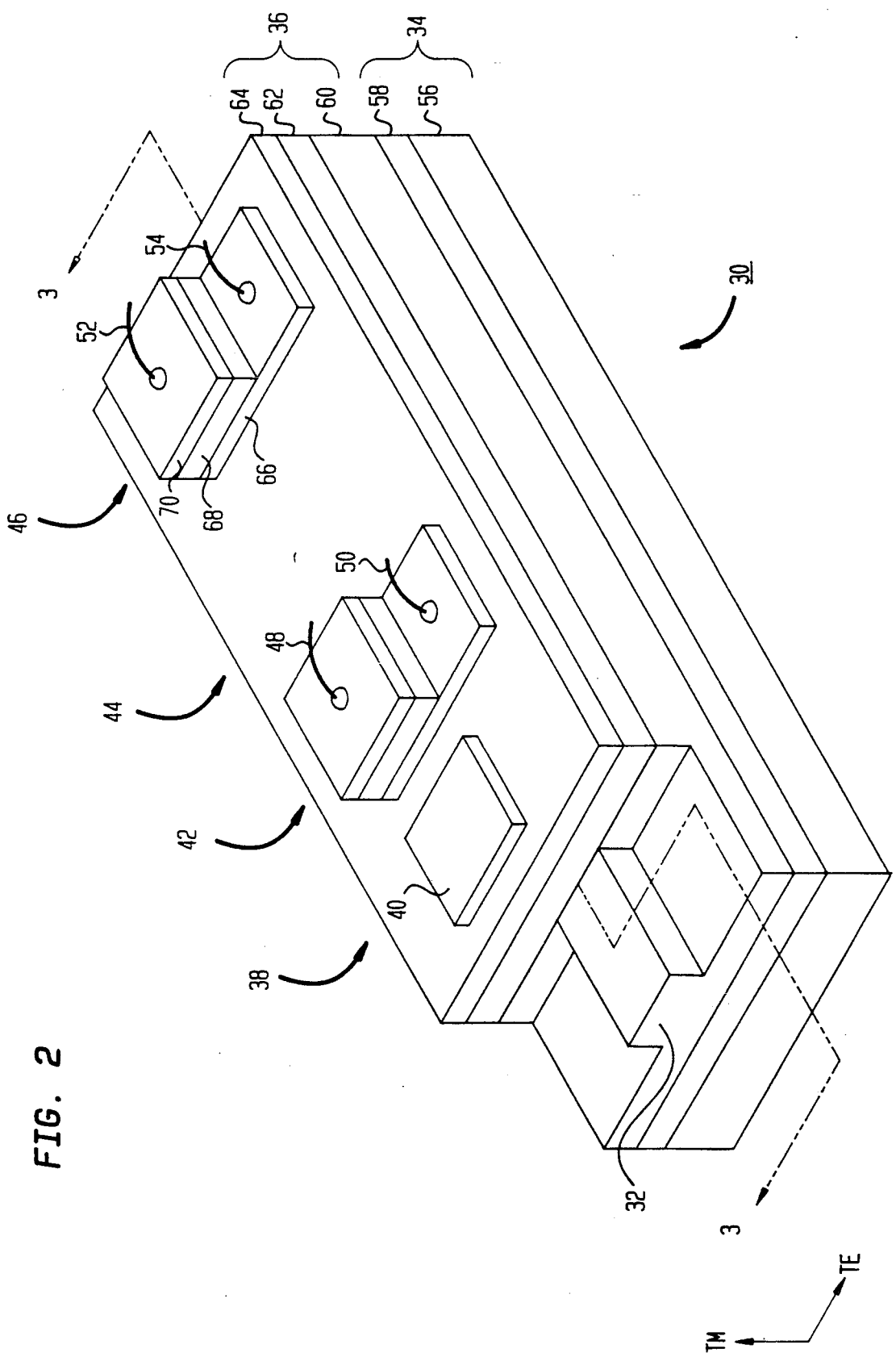
FIG. 2 is a perspective view of an embodiment of a polarization-diversity receiver and polarization splitter of the invention.
Figure 3:
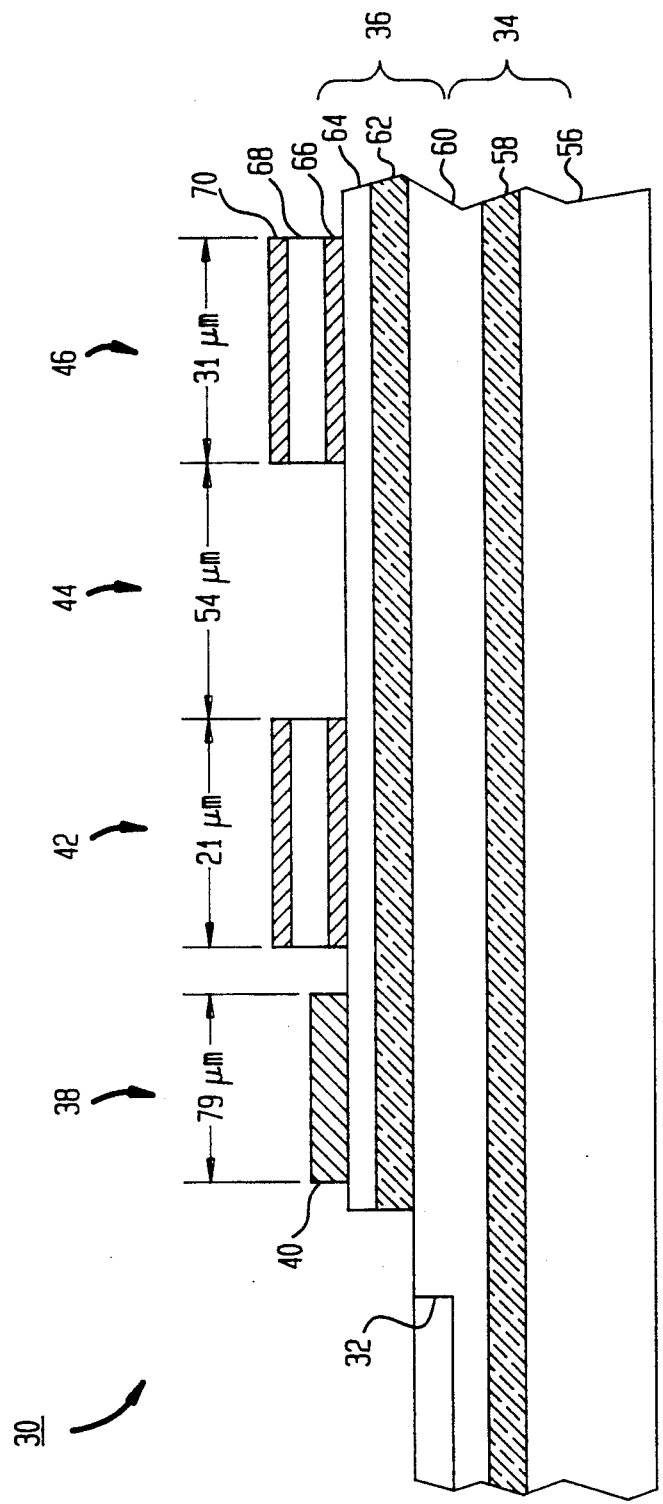
FIG. 3 is a cross-sectional view of the receiver and splitter of FIG. 2 taken along sectional line 3—3.

A first embodiment of a polarization-diversity receiver 30 of the invention is illustrated in the perspective view of FIG. 2 and the cross-sectional view of FIG. 3. Light, input to the receiver 30 on a waveguide laterally defined by a rib 32, is coupled within the receiver 30 to a lower waveguide 34, and they are sufficiently close that optical energy is coupled between them. An upper waveguide 36 overlies the lower waveguide 34. Neither the lower nor upper waveguide 34 or 36 is laterally defined within the receiver 30. The upper cladding of the upper waveguide 36 is sufficiently thin so as to only partially confine the light. A metallically loaded coupler 38 consisting of a metal layer 40 overlying the two waveguides 34 and 36 acts a vertically arranged polarization splitter because it preferentially transfers TE-mode light from the lower waveguide 34 to the upper waveguide 36. A first photo-detector 42 detects the intensity of light on the upper waveguide 36, which is primarily the TE-mode light.

The detection process absorbs most of the TE-mode light. In a coupling region 44, the vertical proximity of the two waveguide 34 and 36 causes the TM-mode light remaining in the lower waveguide 34 to transfer to the upper waveguide 36, on which it is detected by a second photo-detector 46. Further, any TE radiation remaining on the upper waveguide 36 is transferred back to the lower waveguide 34 in the coupling region 44. Leads 48, 50, 52, and 54 connected across the two photo-detectors 42 and 46 bias the detectors and provide respective electrical signals proportional to the intensities of the TE and TM modes, respectively.

EXAMPLE

The receiver 30 with its polarization splitter was fabricated with standard semiconductor processing and then tested. An unpatterned semi-insulating InP:Fe substrate 56 acted as a lower cladding or guiding layer for the lower waveguide 34. An iron concentration of $2\times10^{16}$Fe/cm$^3$ will make InP semi-insulating. All subsequent semiconductor growth was by standard organo-metallic chemical vapor deposition (OMCVD) performed in a single growth sequence. First, an unillustrated 0.2 μm InP:Fe semi-insulating buffer layer was grown over the substrate 56. A lower core or waveguide coupler layer 58 of semi-insulating InGaAsP:Fe was grown over the buffer layer. It had a thickness of 0.45 μm, and its composition was lattice matched to InP and also had an absorption edge $\lambda_g=1.1$ μm. A 1.0 μm thick middle cladding layer 60 of semi-insulating InP:Fe served as partial cladding for both the lower and upper waveguides 34 and 36 and also defined a coupling gap between them. It was thin enough so as to couple optical energy in the lower waveguide 34 into the upper waveguide 36. An upper core or waveguide coupler layer 62 had a thickness of 0.7 μm and the same composition as the lower core layer 58. A 0.15 mm thick upper guiding layer 64 of semi-insulating InP:Fe partially clad the upper waveguide 36.

Above the waveguiding structure, three layers for the p-i-n photo-diodes 42 and 46 were grown, a 0.4 μm thick n$^+$-type layer 66 of InGaAsP doped with sulfur to $1\times10^{18}$ cm$^{-3}$, a 1 μm thick undoped InGaAs intrinsic layer 68, and a 0.23 μm thick p-type layer 70 of InGaAsP doped with zinc to $5\times10^{17}$ cm$^{-3}$. Above the p-type layer 70, there was an unillustrated 0.07 μm thick p$^+$-type layer of InGaAs. All layers in the photo-diode structures had compositions lattice matched to InP, and those of the n$^+$ layer 66 and the p-type layer 70 corresponded to $\lambda_g=1.3$ μm and 1.1 μm respectively. The thickness and conductivity of the n$^+$-type layer 66 was chosen to impedance match the upper waveguide 36 to the photo-diodes 44 and 46. Its thickness and that of the upper guiding layer 64 were thin enough that a substantial portion of optical energy in the upper waveguide 36 was coupled into the photo-diodes 42 and 46.

The p-i-n photo-diodes were laterally defined by photomasking and etching with $H_2SO_4:H_2O_2:H_2O$ (1:1:10, by volume). The first photo-diode 42 had a length of 21 μm while the second photo-diode 46 had a length of 31 μm. They were separated by the coupling region 44 of length 54 μm. All three portions 42, 44, and 46 were aligned along an optical axis. The photo-diode widths were 35 μm so as to intercept all diffracted light. The etching was stopped by a thin 0.02 μm layer of InP that had been deposited above the n$^+$-type layer 66 so as to expose its upper surface for contacting. A second photomasking step and etching down to the upper guiding layer 64 isolated the photo-diodes 42 and 46 but left $60\times60$ μm$^2$ bonding pads for the leads 50 and 54. The capacitance introduced by the bonding pad area could be reduced by depositing over thicker insulating material bonding pads and metal leads interconnecting the pads and the diodes 42 and 46.

Another photomask left an aperture of 79 μm length and 35 μm width along the optical axis, into which was then thermally deposited gold to a thickness of 0.3 μm so as to form the metal layer 40. The metal layer 40 was separated from the first photo-diode 22 by the minimum distances consistent with the minimum feature size of about 2 to 5 μm and from the rib 32 by about 5 μm.

The two coupling regions 38 and 44 and the two photo-diodes 42 and 46 were then covered with a photomask, and the upper cladding layer 64 and the upper waveguide coupler layer 62 were removed in the other areas by sequentially etching with HCl:H$_3$PO$_4$ (1:3, by volume) and the $H_2SO_4:H_2O_2:H_2O$. Another photomask covered the area of the rib 32 to a width of 6 μm and was aligned with the optical axis. Etching with the HCl:H$_3$PO$_4$ then removed part of the middle cladding layer 60 to form the rib 32 for the lower waveguide 14 to a height of 0.45 μm. The leads 48, 50, 52, and 54 were then attached to the two photo-diodes 42 and 46. Finally, polyimide passivated the structure.

The structure was designed such that the first photo-diode 42 outputs TE photocurrent and the second photo-diode 46 outputs TM photocurrent. The design relied on planar guide eigenanalysis with complex refractive refractive indices for the absorbing gold and InGaAs layers following the procedure described by Deri et al. in "Impedance-matching for enhanced waveguide/photodetector integration," *Applied Physics Letters*, volume 55, 1989, pp. 2712-2714 and by correctly accounting for non-orthogonality of power in the eigenmodes, a problem described by Hawkins et al. in "Optical Power transfer in vertically integrated impedance-matched waveguide/photodetectors; physics and implications for diode-length reduction," *Optics Letters*, volume 16, 1991, pp. 470-472. The key parameters in the design were the waveguide thicknesses, composition, and spacing in the vertical couplers.

The total detector length was about 200 μm. The two photo-diodes 42 and 46 exhibited less than 10 nA of leakage current at −8V before passivation and less than 60 nA after passivation. The rib waveguide 13 exhibited a propagation loss of 0.5 dB/cm for 1.52 μm radiation, which is considered good for a III-V waveguide having deep Fe traps and which indicates the usefulness of this rib waveguide for a wide variety of devices. When a microscope objective was used to couple light into the rib waveguide 32, the waveguide insertion loss and radiation propagation were independent of polarization with depolarization below −30 dB.

The polarization sensitivity of the receiver was tested by measuring the two photocurrents as a function of the rotation of the polarization angle of the input light. The maxima and minima corresponded with the identified TE and TM photocurrents. The optical extinction ratio is the ratio of the maximum and minimum photocurrent power during the rotation. The TE photocurrent extinction ratio averaged over 14 receivers on two chips was 10.6 dB and the TM ratio was typically 16.2 dB, somewhat lower than the theoretically predicted values of 15 dB and 30 dB. When the square of the TE and TM photocurrents were added, there was less than 1 dB dependence upon the polarization angle.

The invention is not limited to the disclosed embodiment. Material systems other than InP accommodate a wide range of optical wavelengths. The waveguiding structure may be formed of glassy materials such as silica.

The vertically arranged polarization splitter of the invention both saves chip area and allows fine control over the coupling because epitaxial growth defines the coupling distances. The polarization-diversity receiver of the invention is much simpler and smaller than those available in the prior art, and its fabrication involves a single sequence of epitaxial growth, thus reducing cost and increasing performance. The receiver can be easily integrated with other components in an OEIC.

What is claimed is:

1. A metallically loaded polarization-sensitive coupler, comprising:
    a lower waveguiding structure formed on a substrate;
    an upper waveguiding structure formed over said lower waveguiding structure and separated from said lower waveguiding structure by a coupling region; and
    a metallically loaded element formed in a loading area over said upper waveguiding structure and extending along an optical axis in said coupling region, said metallically loaded element being sufficiently close to a core portion of said upper waveguiding structure that said upper waveguiding structure only partially confines light propagating therein, whereby in said coupling region TE radiation propagating in said lower waveguiding structure is coupled from said lower waveguide structure into said upper waveguide structure to a degree greater than is TM radiation propagating in said lower waveguiding structure.

2. A polarized detector as recited in claim 1, further comprising:
    a first photo-detector formed over a first area adjacent to said loading area and along said optical axis.

3. A polarization-diversity receiver as recited in claim 2, further comprising:
    a second photo-detector formed over a second area of said upper waveguiding structure and along said optical axis, said first and second areas being separated by a coupling length along said optical axis;
    wherein a second coupling region is formed along said coupling length for coupling radiation between said upper and lower waveguiding structures.

4. A receiver as recited in claim 3, wherein both photo-detectors comprise photo-diodes.

5. A receiver as recited in claim 3, further comprising a rib formed in a portion of said lower waveguiding structure away from a receiver area including said loading area, said first area, said coupling length, and said second area, and wherein said upper waveguiding structure is absent in areas distant from said receiver area.

6. A receiver as recited in claim 5, wherein said upper and lower waveguiding structures are laterally undefined adjacent to said coupling length.

7. A coupler as recited in claim 1, wherein both said upper and lower waveguide structures comprise semiconductor materials.

8. A coupler as recited in claim 7, where said semiconductor materials comprise InP and materials lattice-matched thereto.

9. A polarization diversity receiver, comprising:
    a lower cladding layer for confining light;
    a lower core layer formed on said lower cladding layer for propagating light;
    a middle cladding layer formed on said lower guiding layer for only partially confining light;
    an upper core layer formed on said middle cladding layer for propagating light;
    an upper cladding layer formed on said upper core layer for only partially confining light;
    a metal region formed on a first area disposed on an optical axis on top of said upper cladding layer;
    a first optical detector formed on a second area disposed on said optical axis on top of said upper cladding layer; and
    a second optical detector formed on a third area disposed on said optical axis on top of said upper cladding layer and displaced from said first optical detector by an length sufficient to allow TM radiation propagating along said lower core layer to couple into said upper core layer.

10. A receiver as recited in claim 9, wherein all said core and cladding layers and said detectors comprise semiconductors.

* * * * *